United States Patent
Chen et al.

(10) Patent No.: US 11,641,208 B2
(45) Date of Patent: May 2, 2023

(54) FREQUENCY LOCKING METHOD AND CIRCUIT FOR PHASE-LOCKED LOOP

(71) Applicant: SOUTH CHINA UNIVERSITY OF TECHNOLOGY, Guangdong (CN)

(72) Inventors: Zhijian Chen, Guangdong (CN); Ziying Wu, Guangdong (CN); Changjian Zhou, Guangdong (CN); Pengfei Yu, Guangdong (CN); Bin Li, Guangdong (CN); Shaolin Zhou, Guangdong (CN)

(73) Assignee: SOUTH CHINA UNIVERSITY OF TECHNOLOGY, Guangdong (CN)

( * ) Notice: Subject to any disclaimer, the term of this patent is extended or adjusted under 35 U.S.C. 154(b) by 0 days.

(21) Appl. No.: 17/742,336

(22) Filed: May 11, 2022

(65) Prior Publication Data
US 2022/0294459 A1    Sep. 15, 2022

Related U.S. Application Data

(63) Continuation-in-part of application No. PCT/CN2020/126520, filed on Nov. 4, 2020.

(30) Foreign Application Priority Data

Nov. 18, 2019 (CN) .......................... 201911126607.3

(51) Int. Cl.
*H03L 7/099* (2006.01)
*H03L 7/081* (2006.01)
*H03L 7/085* (2006.01)

(52) U.S. Cl.
CPC .............. *H03L 7/099* (2013.01); *H03L 7/081* (2013.01); *H03L 7/085* (2013.01)

(58) Field of Classification Search
CPC .......... H03L 7/099; H03L 7/081; H03L 7/085
See application file for complete search history.

(56) References Cited

U.S. PATENT DOCUMENTS

| 7,940,099 B2* | 5/2011 | Weltin-Wu ........... H03L 7/0991 327/155 |
| 8,174,293 B2* | 5/2012 | Yoshihara ............. G04F 10/005 327/107 |

(Continued)

FOREIGN PATENT DOCUMENTS

| CN | 104052474 | 9/2014 |
| CN | 107863959 | 3/2018 |

(Continued)

OTHER PUBLICATIONS

"International Search Report (Form PCT/ISA/210) of PCT/CN2020/126520", dated Feb. 3, 2021, with English translation thereof, pp. 1-4.

(Continued)

*Primary Examiner* — Adam D Houston
(74) *Attorney, Agent, or Firm* — JCIPRNET

(57) ABSTRACT

A frequency locking method for a phase-locked loop comprises the following steps: S1, a frequency control module controls a numerically controlled oscillator to obtain an maximum output frequency and a minimum output frequency; S2, obtain a minimum frequency ratio and a maximum frequency ratio by means of a time-to-digital converter and the frequency control module; S3, calculate a first frequency control word and a first frequency ratio according to the minimum frequency ratio and the maximum frequency ratio; S4, the frequency control module uses the Newton's iterative method to recalculate a new frequency control word; S5, obtain a new frequency ratio according to the new frequency control word; S6, if the new frequency (Continued)

ratio is within an error range, end iteration and stably output the new frequency control word, and otherwise, jump to step S4.

8 Claims, 5 Drawing Sheets

(56) References Cited

U.S. PATENT DOCUMENTS

| | | | | |
|---|---|---|---|---|
| 8,736,327 | B2* | 5/2014 | Matsuda | G01R 25/08 |
| | | | | 327/158 |
| 10,007,235 | B2* | 6/2018 | Wang | G04F 10/005 |
| 10,263,625 | B1* | 4/2019 | Tokairin | G04F 10/005 |
| 10,862,488 | B2* | 12/2020 | Moe | H03L 7/085 |
| 11,196,956 | B2* | 12/2021 | Akahane | H04N 25/633 |
| 2004/0056728 | A1* | 3/2004 | Dent | H03B 5/366 |
| | | | | 331/158 |
| 2008/0191760 | A1* | 8/2008 | Hao | H03L 7/099 |
| | | | | 327/157 |
| 2015/0349992 | A1* | 12/2015 | Gao | H03L 7/18 |
| | | | | 375/376 |
| 2020/0321968 | A1* | 10/2020 | Yeo | H03L 7/085 |
| 2022/0294459 | A1* | 9/2022 | Chen | H03L 7/085 |
| 2022/0311447 | A1* | 9/2022 | Yang | G04F 10/005 |

FOREIGN PATENT DOCUMENTS

| | | |
|---|---|---|
| CN | 108306638 | 7/2018 |
| CN | 108336994 | 7/2018 |
| CN | 108988864 | 12/2018 |
| CN | 109239676 | 1/2019 |
| CN | 110233619 | 9/2019 |
| CN | 110784212 | 2/2020 |

OTHER PUBLICATIONS

Office Action of China Counterpart Application, dated Mar. 18, 2020, pp. 1-5.
Office Action of China Counterpart Application, dated Apr. 8, 2020, pp. 1-5.

* cited by examiner

FREQUENCY LOCKING METHOD AND CIRCUIT FOR PHASE-LOCKED LOOP

CROSS-REFERENCE TO RELATED APPLICATION

This application is a continuation of international application of PCT application serial no. PCT/CN2020/126520, filed on Nov. 4, 2020, which claims the priority benefit of China application no. 201911126607.3, filed on Nov. 18, 2019. The entirety of each of the above mentioned patent applications is hereby incorporated by reference herein and made a part of this specification.

BACKGROUND

Technical Field

The disclosure relates to the field of new generation information technology, and in particular, relates to a frequency locking method and circuit for a phase-locked loop.

Description of Related Art

With the development of EDA tools and advanced semiconductor technology, digital circuit-assisted RF circuit design has become a trend. For a conventional analog phase-locked loop, a long period of time is generally required from startup to frequency stabilization. Another important property of a phase-locked loop is phase noise. When the voltage-controlled gain of the LC voltage-controlled oscillator used in the analog phase-locked loop increases, the locking time decreases, but the phase noise also increases significantly. For phase-locked loops that require higher frequency resolution, the required locking time may be longer.

A common a fast-locking frequency digital circuit for a phase-locked loop is shown in FIG. 1, and a numerically controlled oscillator A, a time-to-digital converter B, and a frequency control module C are included. The numerically controlled oscillator A is a LC oscillator, and the frequency of the output oscillating signal dco satisfies:

$$f_{dco} \propto \frac{1}{2\pi LC}.$$

The frequency of dco is inversely proportional to the capacitance C, and the frequency control word ctrl_code controls the output frequency of the oscillator by controlling the capacitance array. Therefore, the frequency of dco is also approximately inversely proportional to the frequency control word ctrl_code, and the actual frequency control curve resembles one of the hyperbola. The actual frequency control curve g (ctrl_code) is shown in FIG. 2.

The process of phase locking is divided into coarse tuning and fine tuning stages. The frequency control word controls the output frequency of numerically controlled oscillator A during the coarse tuning phase. However, the general frequency control word and the oscillator output frequency are in a non-linear state, and some algorithms are also used to find the frequency control word, such as dichotomy. However, due to the limitation of locking time, in the general dichotomy method, the number of iterations of the frequency control word will be limited. When the frequency accuracy requirement increases, the iteration increases, and the time consumption also grows. A time-to-digital converter is typically used to convert the phase error to a digital representation for more precise phase lock during the fine tuning stage.

SUMMARY

The technical problem to be solved by the disclosure is aimed at the abovementioned deficiencies of the related art. The first objective of the disclosure is to provide a frequency locking method for a phase-locked loop through which the locking time is effectively reduced.

The second objective of the disclosure is to provide a frequency locking circuit for a phase-locked loop through which the locking time is effectively reduced.

To achieve the first objective, the disclosure provides a frequency locking method for a phase-locked loop, and the method includes the following steps.

In S1, a frequency control module outputs a minimum output frequency control word min_code to a numerically controlled oscillator to obtain a maximum output frequency, and the frequency control module outputs a maximum output frequency control word max_code to the numerically controlled oscillator to obtain a minimum output frequency.

In S2, a time-to-digital converter outputs count information to the frequency control module according to the minimum output frequency to obtain a minimum frequency ratio min_ratio, and the time-to-digital converter outputs the count information to the frequency control module to obtain a maximum frequency ratio max_ratio according to the maximum output frequency.

In S3, an ideal frequency control curve is obtained according to the minimum output frequency control word min_code, the maximum output frequency control word max_code, the minimum frequency ratio min_ratio, and the maximum frequency ratio max_ratio, and a first frequency control word target_code and a first frequency ratio target_ratio are calculated based on the ideal frequency control curve.

In S4, the Newton's iterative method is applied according to the frequency control word target_code and the frequency ratio target_ratio to calculate and obtain a new frequency control word ctrl_code.

In S5, the ctrl_code in step S4 is sent to the numerically controlled oscillator, and a new frequency ratio target_ratio 1 is obtained through the time-to-digital converter and the frequency control module.

In S6, the frequency control module ends the iteration and stably outputs the ctrl_code if an error between the target_ratio and a div_ratio is within a set range; otherwise, let target_code=ctrl_code, and step S4 is repeated.

As a further improvement, the minimum output frequency control word min_code is a hexadecimal number 000, and the maximum output frequency control word max_code is a hexadecimal number FFF.

Further, the ideal frequency control curve in step S3 is frequency_ratio=k*ctrl_code+max_ratio, where k=(max_ratio−min_ratio)/(min_code−max_code), and the first frequency control word target_code is calculated and obtained according to the target frequency ratio div_ratio and the ideal frequency control curve, which satisfies a relation as follows:

div_ratio=k*target_code+max_ratio.

Further, in step S3, a deviation formula is obtained according to the target frequency ratio div_ratio and the corresponding actual frequency control curve g(ctrl_code):

H(ctrl_code)=g(ctrl_code)−div_ratio.

The first frequency control word target_code and the new frequency control word ctrl_code satisfy a relation as follows:

$$H(\text{ctrl\_code})=H(\text{target\_code}).$$

Further, in step S4, according to the Newton's iterative method, following relations are obtained:

$$H'(\text{target\_code}) = \frac{\text{max\_ratio} - \text{target\_ratio}}{\text{min\_code} - \text{target\_code}}$$

$$H(\text{target\_code}) = \text{target\_ratio} - \text{div\_ratio}.$$

A new frequency control word is calculated and obtained through:

$$\text{ctrl\_code} = \text{target\_code} - \frac{H(\text{target\_code})}{H'(\text{target\_code})}.$$

To achieve the second objective, the disclosure provides a frequency locking circuit for a phase-locked loop, and a numerically controlled oscillator, a time-to-digital converter, and a frequency control module are included. The time-to-digital converter includes a delay chain and a counter connected to each other. An output end of the frequency control module is connected to an input end of the numerically controlled oscillator, an output end of the numerically controlled oscillator is connected to an input end of the delay chain, and an output end of the counter is connected to an input end of the frequency control module.

As a further improvement, the numerically controlled oscillator is a LC oscillator.

Further, the delay chain includes a plurality of delay gates and a flip-flop correspondingly connected to each of the delay gates, a control end of the flip-flop is the input end of the delay chain, and an output end of the flip-flop is an output end of the delay chain.

Beneficial Effects

Compared with the related art, the beneficial effects of the disclosure include the following. In the disclosure, the ideal frequency control curve is obtained first according to the minimum frequency ratio and the maximum frequency ratio, and the first frequency control word and the first frequency ratio are calculated. The Newton's iterative method is then applied to calculate the actual frequency control word corresponding to the target frequency ratio, high efficiency is thereby provided, and the locking time is effectively reduced.

DESCRIPTION OF THE EMBODIMENTS

Figure 1:
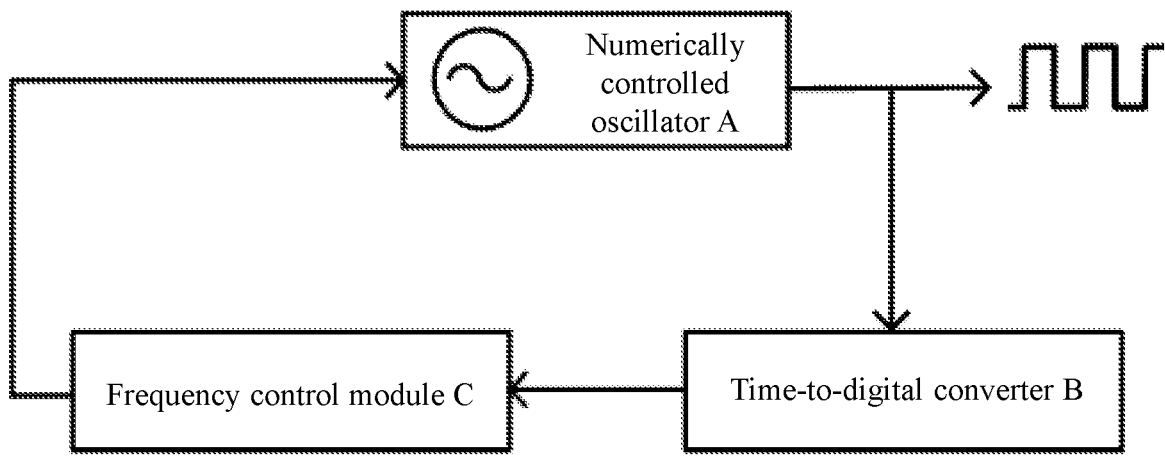
FIG. 1 is a block diagram of a conventional technique.
Figure 2:
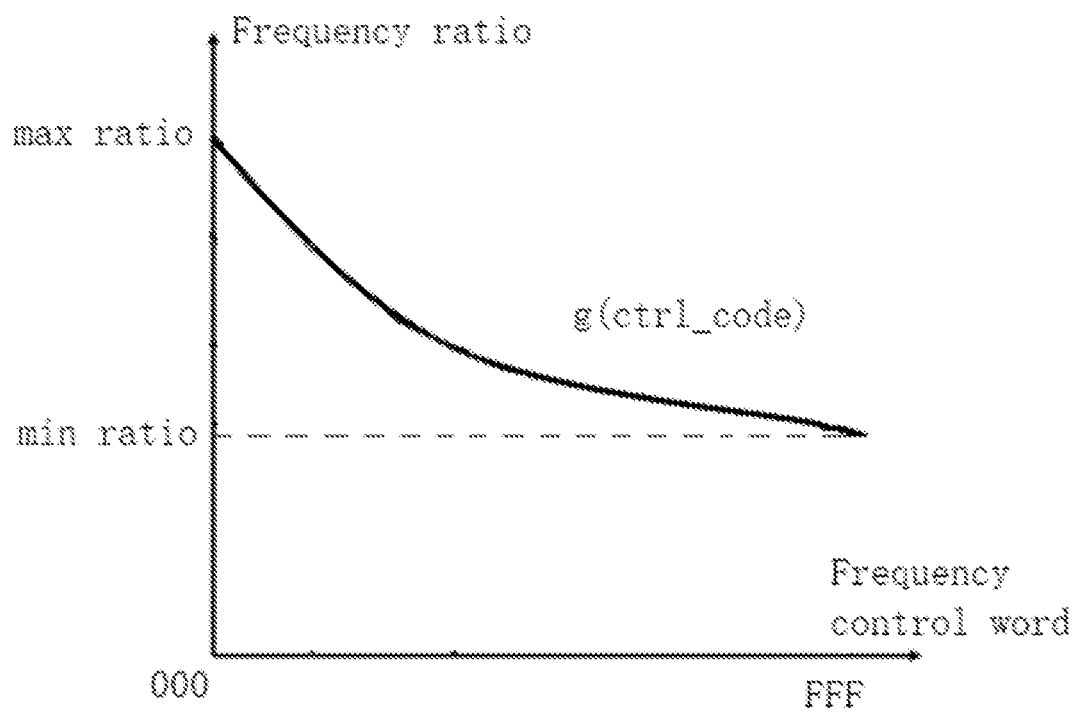
FIG. 2 is a graph of an actual frequency control curve.
Figure 3:
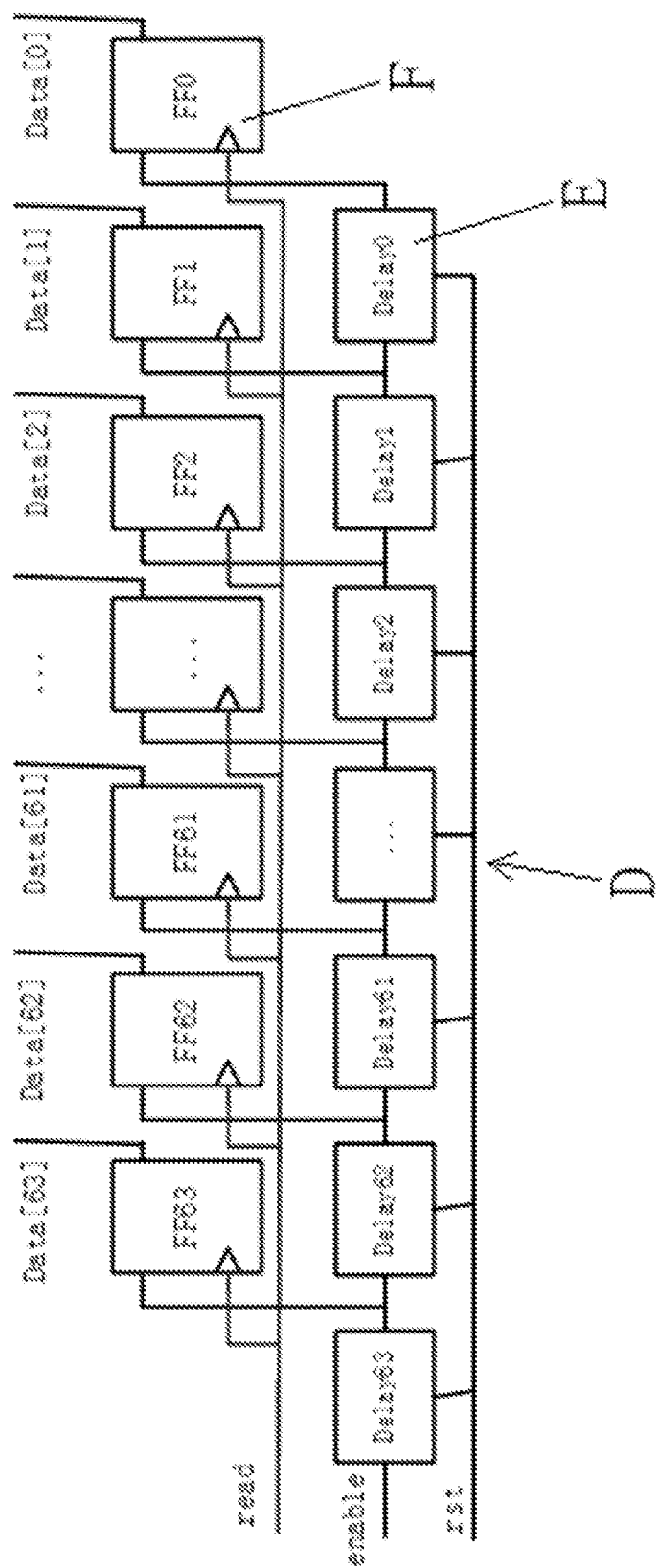
FIG. 3 is a circuit structure diagram of a delay chain in the disclosure.
Figure 4:
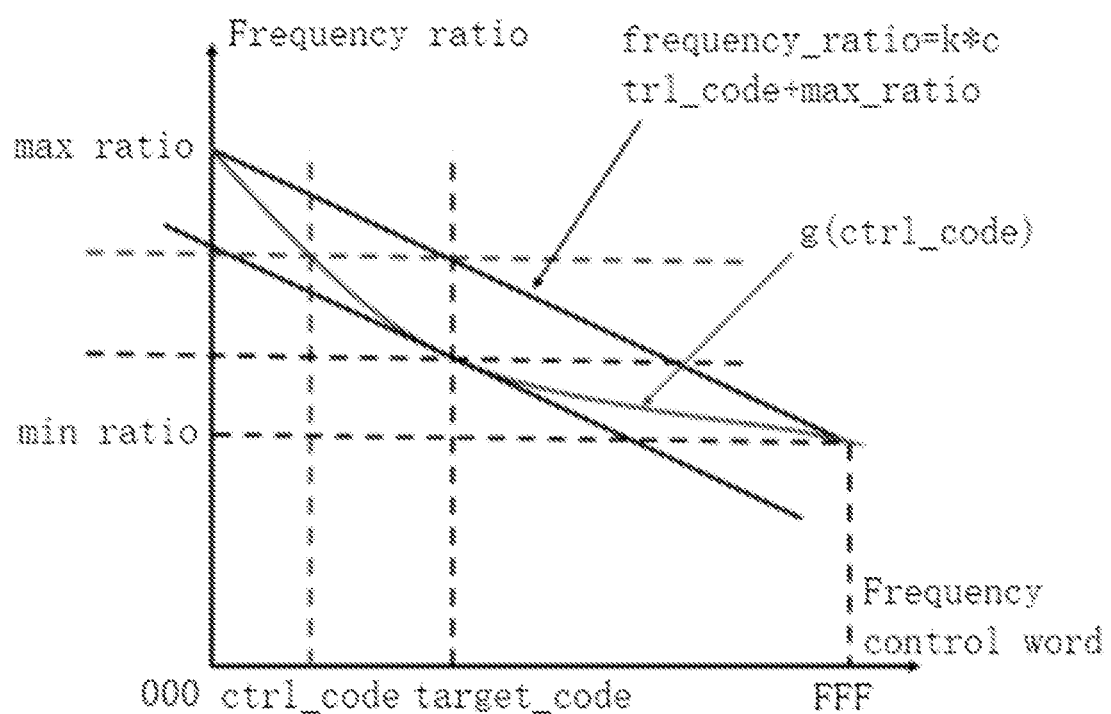
FIG. 4 is a graph of a Newton's iterative operation curve in the disclosure.

The disclosure is further described in detail as follows in combination with accompanying drawings and specific embodiments.

With reference to FIG. 1 to FIG. 6, a frequency locking circuit for a phase-locked loop includes a numerically controlled oscillator A, a time-to-digital converter B, and a frequency control module C. The time-to-digital converter B includes a delay chain D and a counter connected to each other. An output end of the frequency control module C is connected to an input end of the numerically controlled oscillator A, an output end of the numerically controlled oscillator A is connected to an input end of the delay chain D, and an output end of the counter is connected to an input end of the frequency control module C.

In this embodiment, the numerically controlled oscillator A is a LC oscillator. The delay chain includes a plurality of delay gates E and a flip-flop F correspondingly connected to each of the delay gates E, a control end of the flip-flop F is the input end of the delay chain D, and an output end of the flip-flop F is an output end of the delay chain D. The number of delay gates E depends on the delay of the unit delay gate E and a period of oscillating signal output by the numerically controlled oscillator A, and preferably, the delay chain is formed by 64 delay gates E.

A frequency locking method for a phase-locked loop includes the following steps.

In S1, a frequency control module C outputs a minimum output frequency control word min_code to a numerically controlled oscillator A to obtain a maximum output frequency, and the frequency control module C outputs a maximum output frequency control word max_code to the numerically controlled oscillator A to obtain a minimum output frequency.

In S2, a time-to-digital converter B outputs count information to the frequency control module C according to the minimum output frequency to obtain a minimum frequency ratio min_ratio, and the time-to-digital converter B outputs the count information to the frequency control module C to obtain a maximum frequency ratio max_ratio according to the maximum output frequency.

In S3, an ideal frequency control curve is obtained according to the minimum output frequency control word min_code, the maximum output frequency control word max_code, the minimum frequency ratio min_ratio, and the maximum frequency ratio max_ratio, and a first frequency control word target_code and a first frequency ratio target_ratio are calculated based on the ideal frequency control curve.

In S4, the Newton's iterative method is applied according to the frequency control word target_code and the frequency ratio target_ratio to calculate and obtain a new frequency control word ctrl_code.

In S5, the ctrl_code in step S4 is sent to the numerically controlled oscillator A, and a new frequency ratio target_ratio 1 is obtained through the time-to-digital converter B and the frequency control module (C).

In S6, the frequency control module C ends the iteration and stably outputs the ctrl_code if an error between the target_ratio and a div_ratio is within a set range; otherwise, let target_code=ctrl_code, and step S4 is repeated.

In this embodiment, the minimum output frequency control word min_code is a hexadecimal number 000, and the maximum output frequency control word max_code is a hexadecimal number FFF.

In step S3, the ideal frequency control curve in step S3 is $$\text{frequency\_ratio} = k * \text{ctrl\_code} + \text{max\_ratio},$$

where k=(max_ratio−min_ratio)/(min_code−max_code), and the first frequency control word target_code is calculated and obtained according to the target frequency ratio div_ratio and the ideal frequency control curve, which satisfies a relation as follows:

div_ratio=*k*\*target_code+max_ratio.

In step S3, a deviation formula is obtained according to the target frequency ratio div_ratio and the corresponding actual frequency control curve g(ctrl_code):

*H*(ctrl_code)=*g*(ctrl_code)−div_ratio.

The first frequency control word target_code and the new frequency control word ctrl_code satisfy a relation as follows:

*H*(ctrl_code)=*H*(target_code).

In step S4, according to the Newton's iterative method, following relations are obtained:

$$H'(\text{target\_code}) = \frac{\text{max\_ratio} - \text{target\_ratio}}{\text{min\_code} - \text{target\_code}}$$

$$H(\text{target\_code}) = \text{target\_ratio} - \text{div\_ratio}.$$

A new frequency control word is calculated and obtained through:

$$\text{ctrl\_code} = \text{target\_code} - \frac{H(\text{target\_code})}{H'(\text{target\_code})}.$$

Figure 6:
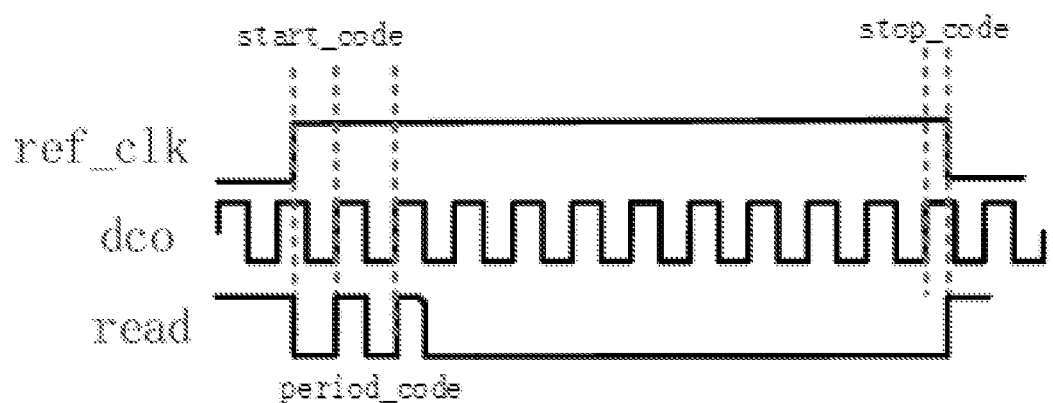
FIG. 6 is a working principle diagram of a time-to-digital converter in the disclosure.

As shown in FIG. 6, the specific working process of the time-to-digital converter B is as follows:

(1) When a rising edge of a reference signal ref_clk is detected, the time-to-digital converter B is started, and the delay chain D starts to work. When a rising edge of a first oscillating signal dco outputted by the numerically controlled oscillator A arrives, a value start_code of the delay chain is read out, the delay chain is reset, and the start_code records a duration of an initial part less than one cycle of dco.

(2) When the next rising edge of the dco arrives, a value period_code of the delay chain is read out again, the delay chain is reset, and period_code records the duration of one cycle of dco.

(3) At a falling edge of a reference clock ref_clk, a value stop_code of the delay chain is read out again, the delay chain is closed, and the stop_code is the duration of an end part less than one cycle of dco.

(4) A counter counts each rising edge of the dco after the rising edge of the reference signal ref_clk and ends at a falling edge of the ref_clk, and a counting result counter_code is obtained. The values outputted by the delay chain are all in the form of thermometer codes.

After receiving the four values: start_code, period_code, stop_code, and counter_code sent by the time-to-digital converter, the frequency control module C first converts the thermometer codes of the delay chain into binary codes corresponding to start_num, period_num, and stop_num and then calculates the frequency ratio frequency_ratio according to the following formulas:

$$x = \frac{\text{start\_num} + \text{stop\_num}}{\text{period\_num}} = \text{integer} + \text{fraction}$$

$$\text{counter\_code} = \begin{cases} \text{counter\_code}, & \text{integer} \geq 1 \\ \text{counter\_code} - 1, & \text{integer} < 1 \end{cases}$$

frequency_ratio = counter_code + fraction.

The result of the first formula above is divided into an integer part and a fractional part, and the integer part is used to correct the counting result of the counter. The frequency ratio frequency_ratio of the output oscillating signal dco and the reference signal ref_clk includes an integer part and a fractional part. When the process makes the delay of the delay unit vary, the above first formula may be used to reduce the influence of the process on the measurement result.

Applications

Figure 5:
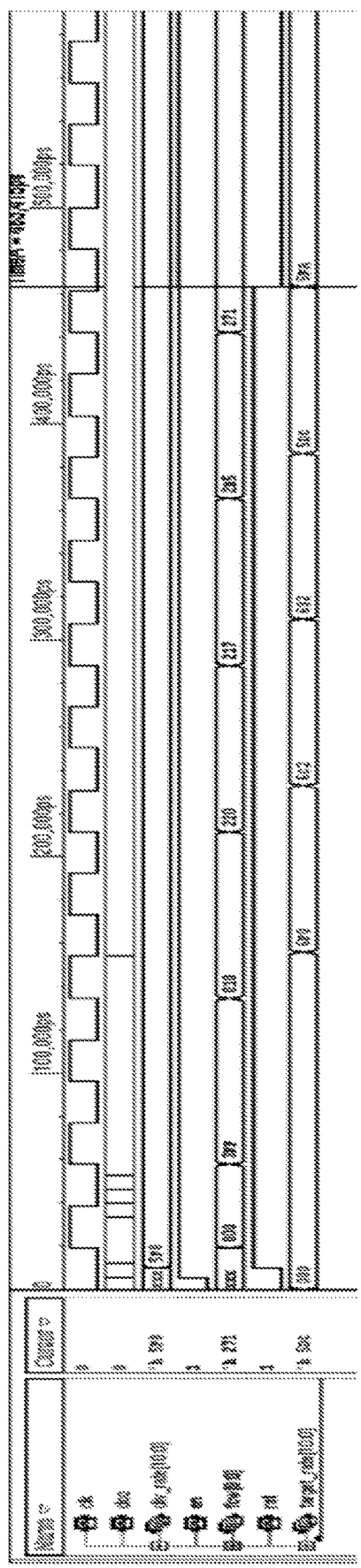
FIG. 5 is a diagram of a simulation result of the disclosure.

Taking the reference signal as a 26 MHz clock and a required frequency division ratio as 47.75 as an example, when a difference between the target frequency ratio and an oscillator output frequency ratio is set to be a binary number of 101, it may be determined that the abovementioned circuit structure of the fast locking frequency may be adopted, and the simulation result is shown in FIG. 5. Herein, few corresponds to ctrl_code in the disclosure, clk corresponds to ref_clk, div_rate corresponds to div_ratio, and target_rate corresponds to the frequency ratio of the output signal of the numerically controlled oscillator to the reference signal. The div_rate is predetermined, and the frequency division ratio is represented by an 11-bit binary number. The first 6 bits represent the integer part, and the last 5 bits represent the fraction part, so the binary number corresponding to 47.75 is the hexadecimal number 5F8. After the fast locking frequency loop is started, the frequency control word few updates the value every two reference clock cycles, and the frequency ratio target_rate may be calculated half the reference cycle after few is updated. By comparing the difference between target_rate (11-bit binary data) and div_rate (11-bit binary data), when the difference is within the set range of binary number 101, it is determined that the frequency is locked, and the frequency control word few will not change. The simulation result in FIG. 5 shows that the frequency locking time is less than 1 us, so in the disclosure, the speed of the phase-locked loop locking the frequency may be improved, and the accuracy of the initial locking frequency is high.

The above are only preferred embodiments of the disclosure. It should be pointed out that for a person having ordinary skill in the art, some modifications and improvements may be made without departing from the structure of the disclosure, which will not affect the effect of the disclosure and the practicability of the patent.

What is claimed is:

1. A frequency locking method for a phase-locked loop, comprising:

S1: outputting, by a frequency control module (C), a minimum output frequency control word min_code to a numerically controlled oscillator (A) to obtain a maximum output frequency, and outputting, by the frequency control module (C), a maximum output frequency control word max_code to the numerically controlled oscillator (A) to obtain a minimum output frequency;

S2: outputting, by a time-to-digital converter (B), count information to the frequency control module (C) according to the minimum output frequency to obtain a minimum frequency ratio min_ratio, and outputting, by the time-to-digital converter (B), count information to the frequency control module (C) according to the maximum output frequency to obtain a maximum frequency ratio max_ratio;

S3: obtaining an ideal frequency control curve according to the minimum output frequency control word min_code, the maximum output frequency control word max_code, the minimum frequency ratio min_ratio, and the maximum frequency ratio max_ratio, and calculating both a first frequency control word target_code and a first frequency ratio target_ratio based on the ideal frequency control curve;

S4: applying a Newton's iterative method according to the first frequency control word target_code and the first frequency ratio target_ratio to calculate and obtain a new frequency control word ctrl_code;

S5: sending the new frequency control word ctrl_code obtained in step S4 to the numerically controlled oscillator (A) and, obtaining a new frequency ratio target_ratio 1 by using the time-to-digital converter (B) and the frequency control module (C); and S6: ending, by the frequency control module (C), a iteration and stably outputting the new frequency control word ctrl_code when an error between the new frequency ratio target_ratio 1 obtained in step S5 and a target frequency ratio div_ratio is within a set range; otherwise, updating a value of the first frequency control word target_code to make it equal to the new frequency control word ctrl_code obtained in step S4, and repeating step S4 to recalculate the new frequency control word ctrl_code.

2. The frequency locking method for the phase-locked loop according to claim 1, wherein the minimum output frequency control word min_code is a hexadecimal number 000, and the maximum output frequency control word max_code is a hexadecimal number FFF.

3. The frequency locking method for the phase-locked loop according to claim 1, wherein the ideal frequency control curve in step S3 is frequency_ratio=$k$*ctrl_code+max_ratio, wherein k=(max_ratio−min_ratio)/(min_code−max_code), and the first frequency control word target_code is calculated according to the target frequency ratio div_ratio and the ideal frequency control curve, which satisfies a relation as follows:

div_ratio=$k$*target_code+max_ratio.

4. The frequency locking method for the phase-locked loop according to claim 1, wherein in step S3, a deviation formula is obtained according to the target frequency ratio div_ratio and a corresponding actual frequency control curve g(ctrl_code):

H(ctrl_code)=g(ctrl_code)−div_ratio, the first frequency control word target_code and the new frequency control word ctrl_code satisfy a relation as follows:

H(ctrl_code)=H(target_code).

5. The frequency locking method for the phase-locked loop according to claim 1, wherein in step S4, according to the Newton's iterative method, some relations are obtained as follows:

$$H'(\text{target\_code}) = \frac{\text{max\_ratio} - \text{target\_ratio}}{\text{min\_code} - \text{target\_code}}$$

H(target_code) = target_ratio − div_ratio, a new frequency control word ctrl_code is calculated and obtained as follows:

$$\text{ctrl\_code} = \text{target\_code} - \frac{H(\text{target\_code})}{H'(\text{target\_code})}.$$

6. A frequency locking circuit for a phase-locked loop to realizing the frequency locking method in claim 1, comprising a numerically controlled oscillator (A), a time-to-digital converter (B), and a frequency control module (C), wherein the time-to-digital converter (B) comprises a delay chain (D) and a counter connected to each other, an output end of the frequency control module (C) is connected to an input end of the numerically controlled oscillator (A), an output end of the numerically controlled oscillator (A) is connected to an input end of the delay chain (D), and an output end of the counter is connected to an input end of the frequency control module (C), wherein the frequency control module (C) is configured to output a minimum output frequency control word min_code to the numerically controlled oscillator (A) to obtain a maximum output frequency, and the frequency control module (C) is configured to output a maximum output frequency control word max_code to the numerically controlled oscillator (A) to obtain a minimum output frequency, wherein the time-to-digital converter (B) is configured to output count information to the frequency control module (C) according to the minimum output frequency to obtain a minimum frequency ratio min_ratio, the time-to-digital converter (B) is configured to output the count information to the frequency control module (C) to obtain a maximum frequency ratio max_ratio according to the maximum output frequency, wherein an ideal frequency control curve is obtained according to the minimum output frequency control word min_code, the maximum output frequency control word max_code, the minimum frequency ratio min_ratio, and the maximum frequency ratio max_ratio, wherein a first frequency control word target_code and a first frequency ratio target_ratio are calculated based on the ideal frequency control curve, wherein a Newton's iterative method is applied to calculate and obtain a new frequency control word ctrl_code, and the new frequency control word ctrl_code is transmitted to the numerically controlled oscillator (A) to obtain a new frequency ratio target_ratio 1.

7. The frequency locking circuit for the phase-locked loop according to claim 6, wherein the numerically controlled oscillator (A) is a LC oscillator.

8. The frequency locking circuit for the phase-locked loop according to claim 6, wherein the delay chain comprises a plurality of delay gates (E) and a flip-flop (F) correspondingly connected to each of the delay gates (E), a control end of the flip-flop (F) is an input end of the delay chain (D), and an output end of the flip-flop (F) is an output end of the delay chain (D).

* * * * *